(12) United States Patent
Goel et al.

(10) Patent No.: US 10,156,609 B2
(45) Date of Patent: Dec. 18, 2018

(54) DEVICE AND METHOD FOR ROBUSTNESS VERIFICATION

(71) Applicant: TAIWAN SEMICONDUCTOR MANUFACTURING CO., LTD., Hsinchu (TW)

(72) Inventors: Sandeep Kumar Goel, Dublin, CA (US); Stanley John, Fremont, CA (US); Ji-Jan Chen, Kaohsiung (TW); Yun-Han Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 64 days.

(21) Appl. No.: 15/602,365

(22) Filed: May 23, 2017

(65) Prior Publication Data
US 2018/0164369 A1 Jun. 14, 2018

Related U.S. Application Data

(60) Provisional application No. 62/433,312, filed on Dec. 13, 2016.

(51) Int. Cl.
*G01R 31/3183* (2006.01)
*H03K 19/20* (2006.01)
*G01R 31/28* (2006.01)

(52) U.S. Cl.
CPC ..... *G01R 31/3183* (2013.01); *G01R 31/2834* (2013.01); *H03K 19/20* (2013.01)

(58) Field of Classification Search
CPC ... G01R 31/2834; H03K 19/20; H03K 3/3565
See application file for complete search history.

(56) References Cited

U.S. PATENT DOCUMENTS

| 5,929,650 A * | 7/1999 | Pappert | G01R 31/3008 324/750.3 |
| 8,624,653 B2 * | 1/2014 | Nagda | G01R 31/31703 327/307 |
| 2003/0128606 A1 * | 7/2003 | Chuang | G11C 29/028 365/201 |

* cited by examiner

*Primary Examiner* — Giovanni Astacio-Oquendo
*Assistant Examiner* — Alvaro Fortich
(74) *Attorney, Agent, or Firm* — McClure, Qualey & Rodack, LLP (57) ABSTRACT

A device includes a fault generation circuit and a first fault injection circuit. The fault generation circuit is configured to generate a fault signal and a plurality of control signals according to a mode signal. The first fault injection circuit is configured to inject a first final fault signal to an under-test device based on the fault signal and the plurality of control signals, in order to verify robustness of the under-test device.

20 Claims, 6 Drawing Sheets

FIG. 6

DEVICE AND METHOD FOR ROBUSTNESS VERIFICATION

RELATED APPLICATIONS

This application claims priority to U.S. Provisional Application Ser. No. 62/433,312, filed Dec. 13, 2016, which is herein incorporated by reference.

BACKGROUND

With developments of technology, various functional circuits are integrated on one or more chips, to form system-on-chip (SOC). Due to different applications or different operational environments, failures may be introduced to the functional circuits. On condition that the failures exist in the functional circuits, the functions of the functional circuits may change. Thus, robustness verification for SOC is very critical.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Figure 1:
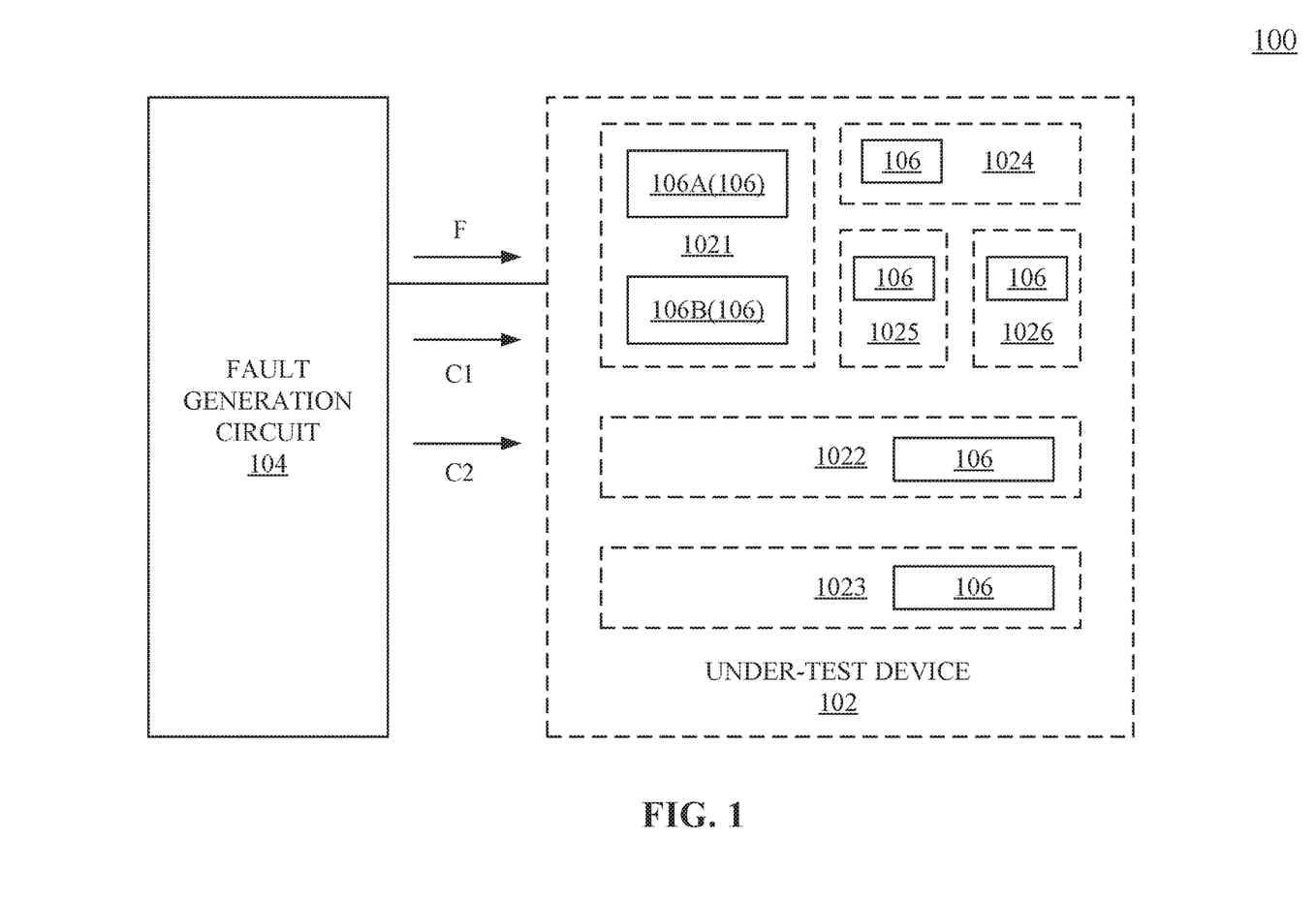
FIG. 1 is a schematic diagram of a device, in accordance with some embodiments of the present disclosure.

Reference is now made to FIG. 1. FIG. 1 is a schematic diagram of a device 100, in accordance with some embodiments of the present disclosure.

In some embodiments, the device 100 is a hardware-based device. For example, the device 100 can be implemented with one or more integrated circuits. As illustratively shown in FIG. 1, the device 100 includes a fault generation circuit 104 and one or more fault injection circuits 106. In some embodiments, the fault generation circuit 104 is coupled to the fault injection circuits 106. In some embodiments, the fault generation circuit 104 and the fault injection circuits 106 are configured to verify robustness of an under-test device 102. In some embodiments, the fault injection circuits 106 are disposed in and integrated with the under-test device 102. In some embodiments, the fault generation circuit 104 and the fault injection circuits 106 are arranged on automated test equipment (ATE) or on a system board. Explained in a different way, in these embodiments, the robustness verification of the under-test device 102 is performed on the ATE or the system board.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, the under-test device 102 is applied in a system-on-chip (SOC). In some embodiments, the under-test device 102 includes one or more functional circuits 1021-1026. For example, the functional circuit 1021 is a central processing unit (CPU), the functional circuit 1022 is a network on a chip (NOC)/BUS module, the functional circuit 1023 is a static random access memory (SRAM), and the functional circuits 1024-1026 are various functional circuits.

Figure 2:
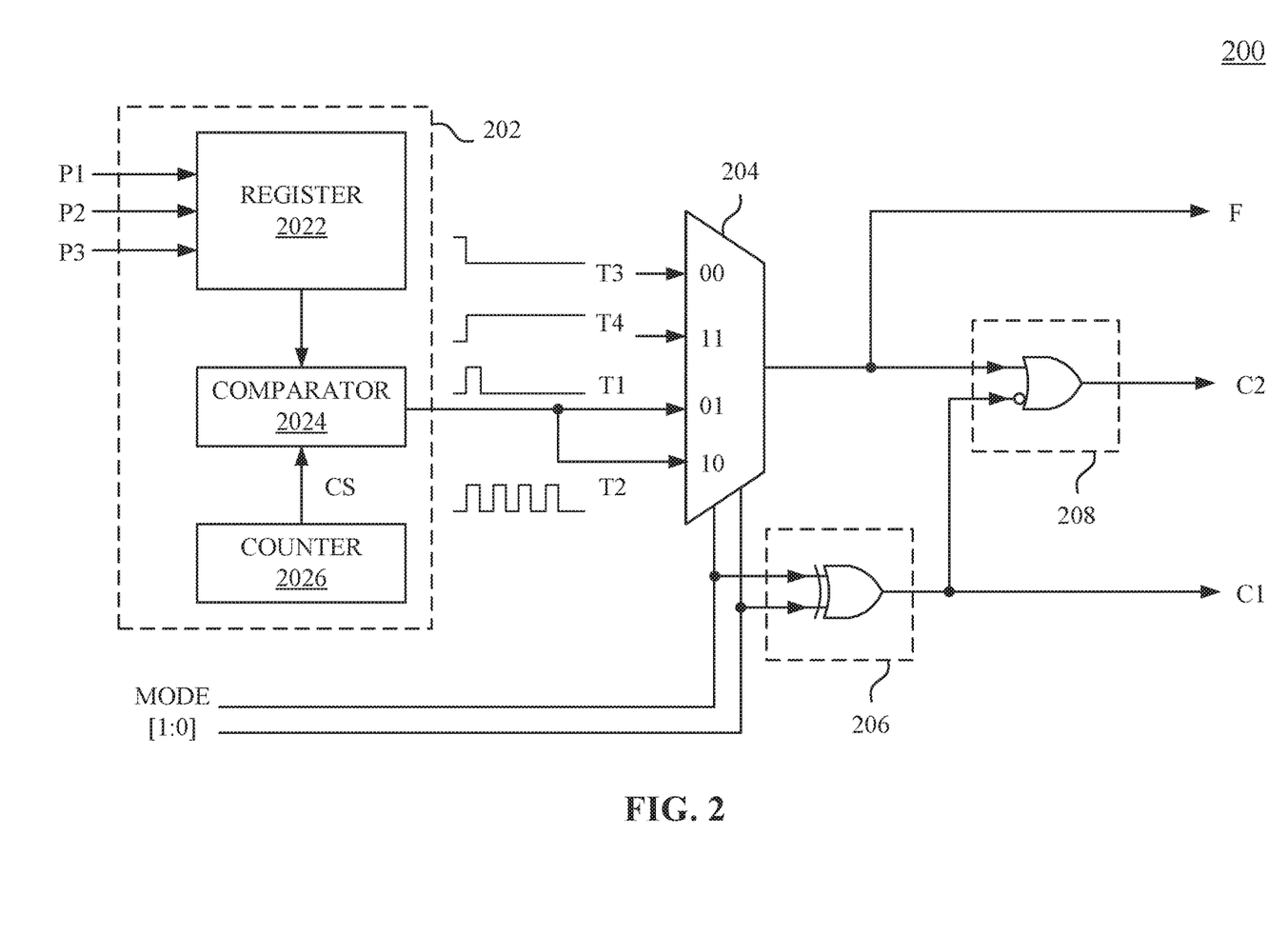
FIG. 2 is a schematic diagram illustrating a fault generation circuit in the device in FIG. 1, in accordance with some embodiments of the present disclosure.
Figure 3:
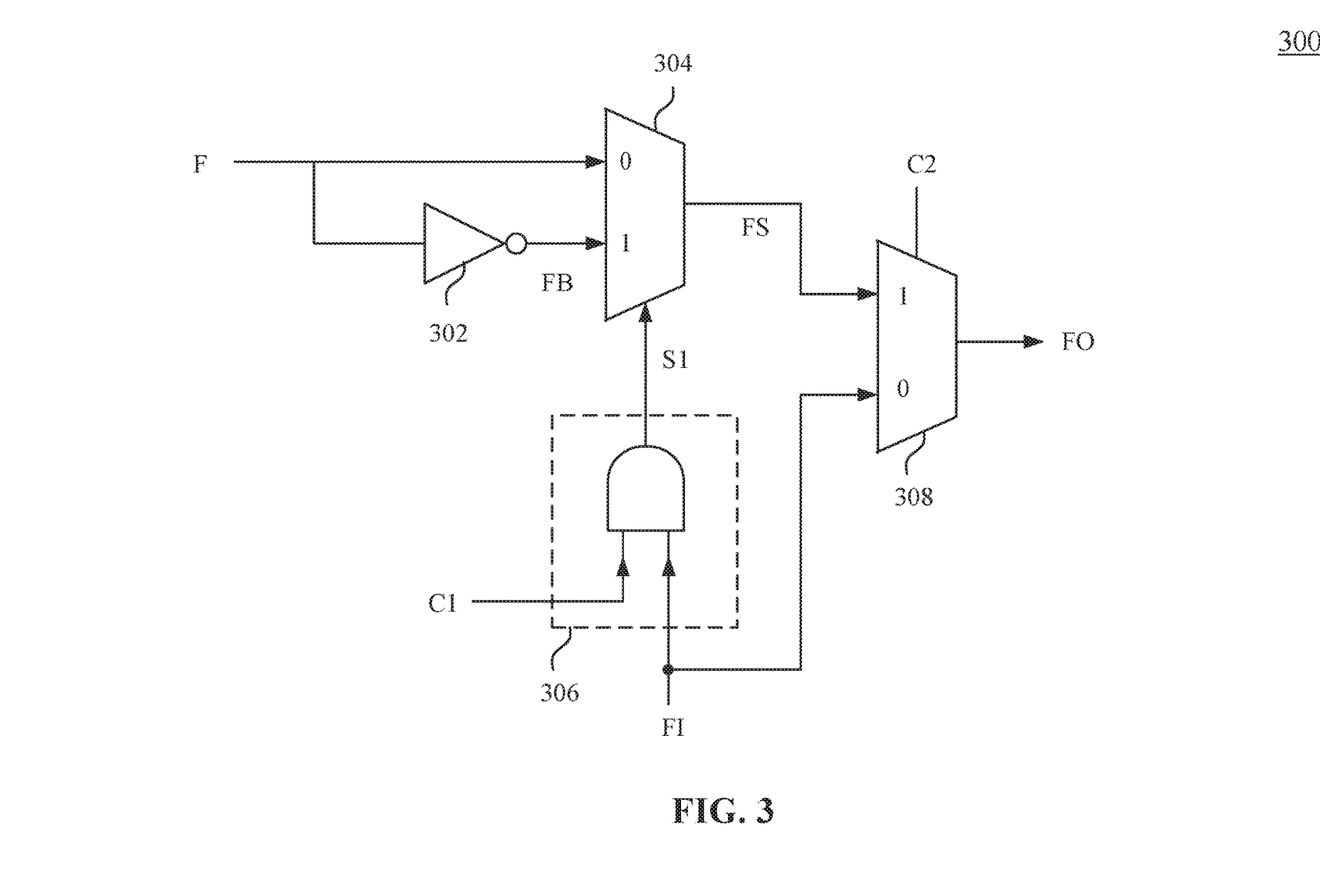
FIG. 3 is a schematic diagram illustrating a fault injection circuit in the device in FIG. 1, in accordance with some embodiments of the present disclosure.

In some embodiments, the fault generation circuit 104 is configured to generate a fault signal F and control signals C1 and C2 according to a mode signal MODE (as shown in FIG. 2). In some embodiments, each of the fault injection circuits 106 is configured to generate a final fault signal FO (as shown in FIG. 3) according to the fault signal F and the control signals C1 and C2. In some embodiments, each of the fault injection circuits 106 is configured to inject the final fault signal FO to a corresponding functional circuit of the under-test device 102. For example, the fault injection circuit 106 (for example, the fault injection circuit 106A or 106B) injects the final fault signal FO to the functional circuit 1021. In some further embodiments, the final fault signal FO is injected to a node of the functional circuit 1021. In some embodiments, the node is an input/output (I/O) terminal of a logic gate of the functional circuit 1021. In some embodiments, the node is between two logic gates of the functional circuit 1021.

Figure 5:
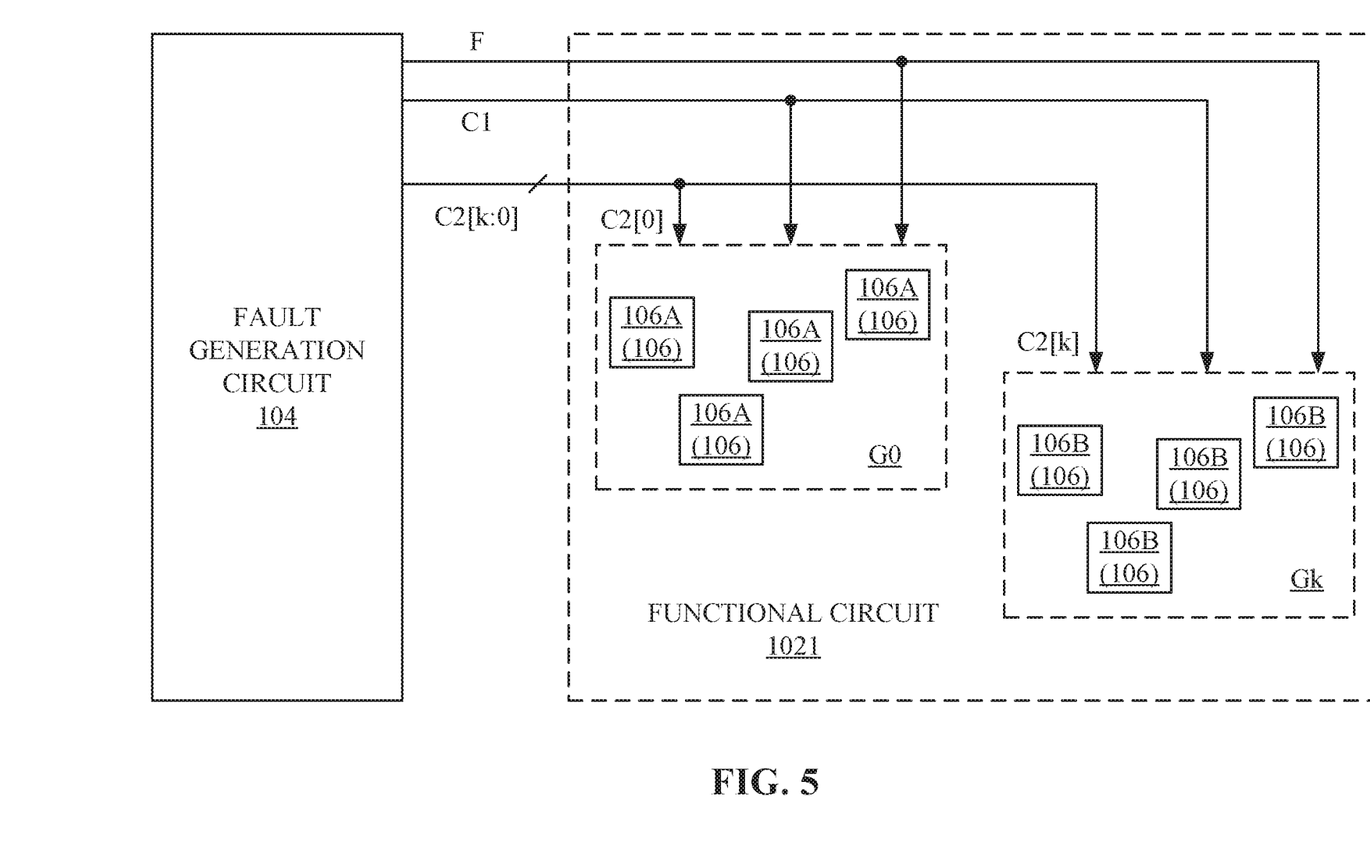
FIG. 5 is a schematic diagram illustrating a fault generation circuit and a functional circuit in FIG. 1, in accordance with some embodiments of the present disclosure.

The configurations of the device 100 are given for illustrative purposes only. Various configurations of the device 100 are within the contemplated scope of the present disclosure. For example, in some embodiments, as shown in FIG. 5 below, multiple fault injection circuits 106A and 106B are employed to inject the final fault signals FO to the functional circuit 1021.

FIG. 2 is a schematic diagram illustrating the fault generation circuit 104 in FIG. 1, in accordance with some embodiments of the present disclosure. FIG. 3 is a schematic diagram illustrating the fault injection circuit 106 in FIG. 1, in accordance with some embodiments of the present disclosure. In some embodiments, the fault generation circuit 104 in FIG. 1 is implemented with a circuit 200 in FIG. 2, and the fault generation circuit 106 in FIG. 1 is implemented with a circuit 300 in FIG. 3. The circuit 200 is coupled to the circuit 300. For ease of understanding, with respect to the embodiments of FIG. 1, like elements in FIGS. 2-3 are designated with the same reference numbers.

Reference is now made to FIG. 2. As illustratively shown in FIG. 2, the circuit 200 includes a pulse width modulation (PWM) circuit 202, a multiplexer 204, and logic gates 206 and 208. The PWM circuit 202 is coupled to the multiplexer 204. The multiplexer 204 is coupled to the logic gates 206 and 208.

In some embodiments, the PWM circuit 202 is configured to generate test signals T1 and T2 according to pulse count information P1, pulse duty information P2, and pulse period information P3. In some embodiments, the pulse count information P1 is employed to indicate a number of pulses in a signal. In some embodiments, the pulse duty information P2 is employed to indicate a value of a duty cycle of a signal. In some embodiments, the pulse period information P3 is employed to indicate a time interval of a period of a pulse in a signal. In some embodiments, a test signal (for example, the test signal T1 or T2) having one or more pulses is able to be generated based on the pulse count information P1, the pulse duty information P2, and the pulse period information P3.

In some embodiments, the PWM circuit 202 includes a register 2022, a comparator 2024, and a counter 2026. In some embodiments, the pulse count information P1, the pulse duty information P2, and the pulse period information P3, as discussed above, are stored in the register 2022.

In some embodiments, the counter 2026 is configured to counts a number of pulses in a clock signal (not shown), in order to output a count signal CS to the comparator 2024. For example, when the number of pulses counted by the counter 2026 is 5, a signal value of the count signal CS is 5. In some embodiments, the counter 2026 is reset based on the pulse period information P3. For example, the counter 2026 is reset on condition that the number of pulses counted by the counter 2026 is the same to a predetermined number indicated by the pulse period information P3. The configuration of the counter 2026 is given for illustrative purposes only. Various configurations of the counter 2026 are within the contemplated scope of the present disclosure.

Input terminals of the comparator 2024 are coupled to the register 2022 and the counter 2026. An output terminal of the comparator 2024 is coupled to the multiplexer 204. In some embodiments, the comparator 2024 is configured to compare the count signal CS and the number of pulses indicated by the pulse duty information P2, in order to output test signals T1 and T2.

The configurations of the PWM circuit 202 are given for illustrative purposes only. Various configurations of the PWM circuit 202 are within the contemplated scope of the present disclosure.

In some embodiments, the multiplexer 204 is configured to receive the test signal T1 and T2 from the PWM circuit 202, and to receive test signals T3 and T4. In some embodiments, the test signal T3 or T4 is generated by various logic circuits. In some embodiments, the multiplexer 204 is configured to select one of the test signals T1-T4 according to the mode signal MODE. The selected test signal is outputted by the multiplexer 204 as the fault signal F. As discussed below, in some embodiments, the test signals T1-T4 are generated to indicate different fault behaviors for verifying the robustness of the under-test device 102.

In some embodiments, the logic gate 206 is configured to output the control signal C1 according to the mode signal MODE. In some embodiments, the logic gate 206 is implemented with an exclusive OR gate. The logic gate 206 performs an exclusive OR operation of the mode signal MODE, in order to generate the control signal C1.

In some embodiments, the logic gate 208 is configured to output the control signal C2 according to the fault signal F and the control signal C1. In some embodiments, the logic gate 208 is implemented with an OR gate. In some embodiments, the logic gate 208 has an input terminal and an inversed input terminal. The fault signal F and the control signal C1 are respectively transmitted to the input terminal and the inversed input terminal. The logic gate 208 performs an OR operation of the fault signal F and an inversed signal that is an inverse of the control signal C1, in order to generate the control signal C2.

The implementations of the logic gates 206 and 208 are given for illustrative purposes only. Various implementations of the logic gates 206 and 208 are within the contemplated scope of the present disclosure. For example, the logic gates 206 and 208 can be implemented by other logic gates.

The configurations of the circuit 200 are given for illustrative purposes only. Various configurations of the circuit 200 are within the contemplated scope of the present disclosure.

Reference is now made to FIG. 3. In some embodiments, the circuit 300 is configured to generate the final fault signal FO according to the fault signal F and control signals C1 and C2 that are transmitted from the circuit 200. As illustratively shown in FIG. 3, the circuit 300 includes an inverter 302, a multiplexer 304, a logic gate 306, and a multiplexer 308. The inverter 302 and the logic gate 306 are coupled to the multiplexer 304. The multiplexer 304 is coupled to the multiplexer 308.

In some embodiments, the inverter 302 is configured to receive the fault signal F from the circuit 200 and to invert the same, in order to generate an inversed signal FB. Effectively, the inversed signal FB is an inverse of the fault signal F. The fault signal F and the inversed signal FB are transmitted to two input terminals of the multiplexer 304.

In some embodiments, the multiplexer 304 is configured to select one of the fault signal F and the inversed signal FB according to a select signal S1. The selected signal of the fault signal F and the inversed signal FB is then outputted by the multiplexer 304 as a signal FS. The signal FS and a fault free signal FI are transmitted to two input terminals of the multiplexer 308.

In some embodiments, the logic gate 306 is configured to output the select signal S1 according to the fault free signal FI and the control signal C1 that is from the circuit 200 in FIG. 2. In some embodiments, the logic gate 306 is implemented with an AND gate. The logic gate 306 performs an AND operation of the control signal C1 and the fault free signal FI, in order to generate the select signal S1. The select signal S1 is transmitted to the multiplexer 304 for the aforementioned select operation of the multiplexer 304.

In some embodiments, the multiplexer 308 is configured to select one of the signal FS and the fault free signal FI according to the control signal C2 from the circuit 200 in FIG. 2. The selected signal of the signal FS and the fault free signal FI is then outputted by the multiplexer 308 as the final fault signal FO.

The configurations of the circuit 300 are given for illustrative purposes only. Various configurations of the circuit 300 are within the contemplated scope of the present disclosure.

Figure 4:
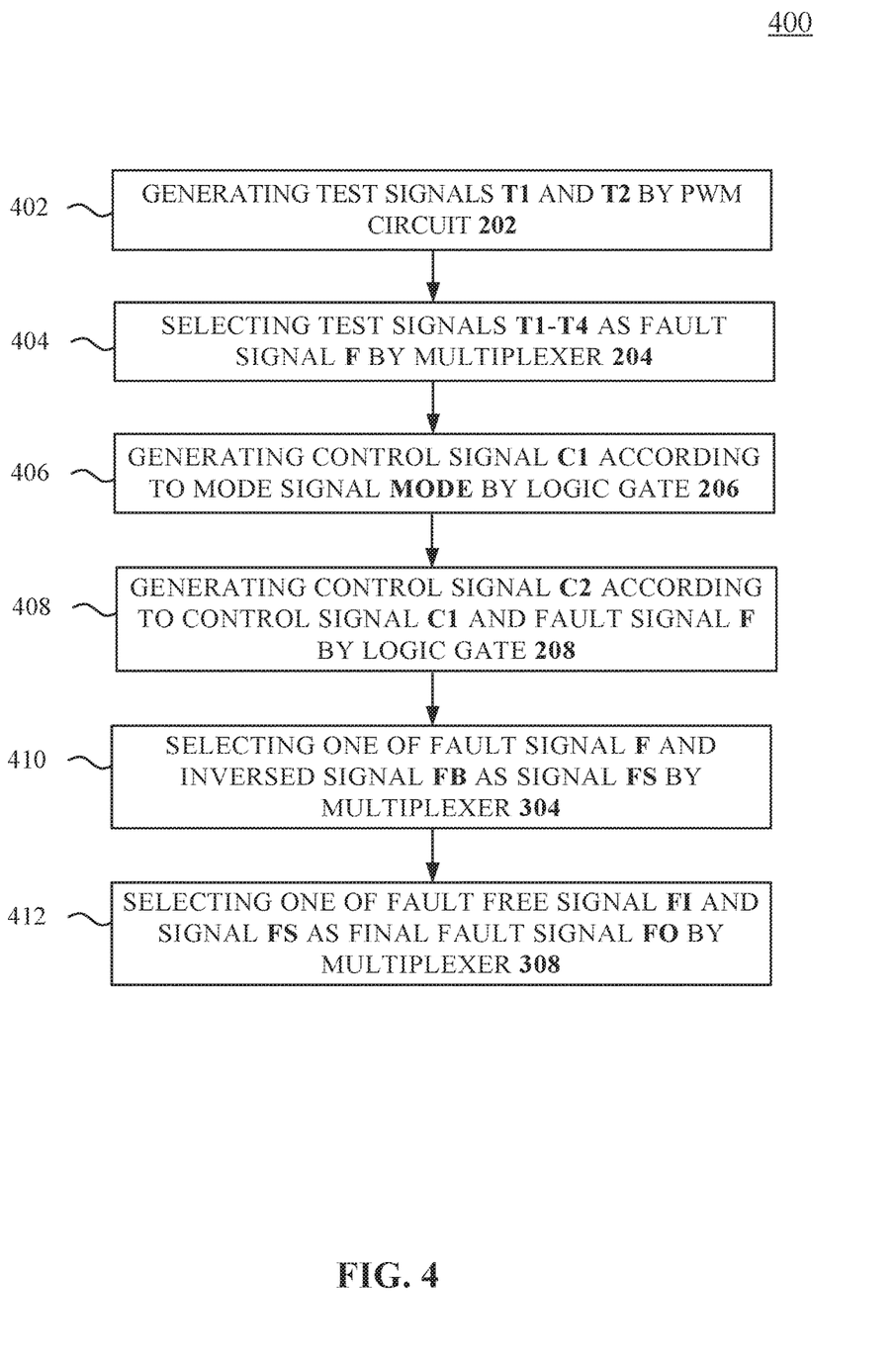
FIG. 4 is a flow chart of a method illustrating operations of the circuits in FIG. 2 and FIG. 3, in accordance with some embodiments of the present disclosure.

Reference is now made to FIG. 4. FIG. 4 is a flow chart of a method 400 illustrating operations of the circuit 200 in FIG. 2 and the circuit 300 in FIG. 3, in accordance with some embodiments of the present disclosure. For better understanding of the present disclosure, the method 400 is discussed in relation to the circuit 200 in FIG. 2 and the circuit 300 in FIG. 3, but the present disclosure is not limited thereto. In some embodiments, the method 400 includes operations 402, 404, 406, 408, 410, and 412.

In operation 402, the PWM circuit 202 in FIG. 2 generates the test signals T1 and T2 according to the pulse count information P1, the pulse duty information P2, and the pulse period information P3. In some embodiments, the counter 2026 is implemented with an up counter or a down counter. As discussed above, the comparator 2024 outputs the test signals T1 and T2 by comparing the count signal CS and the number of pulses indicated by the pulse duty information P2 stored in the register 2022. For example, if the counter 2026 is implemented with the down counter, the test signal T1 or T2 has a high voltage level on condition that the count signal CS is greater than or is equal to the number of pulses indicated by the pulse duty information P2. Correspondingly, the test signal T1 or T2 has a low voltage level on condition that the count signal CS is less than the number of pulses indicated by the pulse duty information P2. For another example, if the counter 2026 is implemented with the up counter, the test signal T1 or T2 has a high voltage level on condition that the count signal CS is less than the number of pulses indicated by the pulse duty information P2. Correspondingly, the test signal T1 or T2 has a low voltage level on condition that the count signal CS is equal to or is greater than the number of pulses indicated by the pulse duty information P2. Thus, a pulse duty of the test signal T1 or T2 can be determined based on the pulse duty information P2.

As discussed above, the counter 2026 is reset on condition that the number of pulses counted by the counter 2026 is the same to a predetermined number indicated by the pulse period information P3. Thus, a pulse period of the test signal T1 or T2 can be determined based on the pulse period information P3.

In some embodiments, a pulse number of the test signal T1 or T2 is determined based on the pulse count information P1. For example, according to the pulse count information P1, the test signal T1 is determined to have a single pulse, and the test signal T2 is determined to have multiple pulses, in which the duty cycle and the period of the pulses are determined according to the pulse duty information P2 and the pulse period information P3 respectively.

Effectively, waveforms of test signals T1 and T2 are able to be determined based on the pulse count information P1, the pulse duty information P2, and the pulse period information P3. In some embodiments, the test signal T1 having the single pulse is generated to indicate a fault behavior associated with a single transient (or a bit-flip) in an output signal. In some embodiments, the single transient is referred to as a single bit that is transited from a logic value "0" or "1" to the logic value "1" or "0" for one cycle. In some embodiments, the test signal T2 having the multiple pulses is generated to indicate a fault behavior associated with a soft error (or a burst) in an output signal. In some embodiments, the burst is referred to as a single bit that is repeatedly transited from a logic value "0" to the logic value "1" for multiple cycles.

In operation 404, the multiplexer 204 in FIG. 2 selects one of the test signals T1-T4 as the fault signal F according to the mode signal MODE. In some embodiments, the test signals T1 and T2 are configured to indicate dynamic faults. For example, the test signals T1 and T2 are PWM signals. In some embodiments, the test signals T3 and T4 are configured to indicate static faults. For example, a voltage level of the test signal T3 is kept as a level corresponding to a logic value "0," and a voltage level of the test signal T4 is kept as a level corresponding to a logic value "1." In some embodiments, the test signal T3 is referred to as "stuck at 0." In some embodiments, the test signal T4 is referred to as "stuck at 1." In some embodiments, the mode signal MODE includes two bits. The multiplexer 204 selects one of the test signal T1-T4 according to the two bits of the mode signal MODE. For example, the test signal T3 is selected on condition that the bit values of the mode signal MODE are "00." The test signal T4 is selected on condition that the bit values of the mode signal MODE are "11." The test signal T1 is selected on condition that the bit values of the mode signal MODE are "01." The test signal T2 is selected on condition that the bit values of the mode signal MODE are "10."

In operation 406, the logic gate 206 in FIG. 2 generates the control signal C1 according to the mode signal MODE. In some embodiments, with the exclusive OR operation of the logic gate 206, the control signal C1 has a logic value "1" on condition that bit values of the two bits of the mode signal MODE are different. Correspondingly, the control signal C1 has a logic value "0" on condition that the bit values are the same. For example, the control signal C1 has the logic value "1" on condition that the mode signal MODE corresponds to "01" or "10." Correspondingly, the control signal C1 has the logic value "0" on condition that the mode signal MODE corresponds to "00" or "11." Explained in a different way, the control signal C1 has the logic value "1" on condition that the dynamic fault (for example, the test signal T1 or T2) is selected. Correspondingly, the control signal C1 has the logic value "0" on condition that the static fault (for example, the test signal T3 or T4) is selected.

In operation 408, the logic gate 208 in FIG. 2 generates the control signal C2 according to the control signal C1 and the fault signal F. In some embodiments, with the OR operation of the logic gate 208, the control signal C2 has a logic value "1" on condition that the control signal C1 has the logic value "0." As described above, the control signal C1 has a logic value "0" on condition that the test signal T3 or T4 is selected. Thus, the control signal C2 has the logic value "1" on condition that the test signal T3 or T4 is selected. Correspondingly, the control signal C2 changes with respect to the fault signal F on condition that the control signal C1 has a logic value "1." As described above, the control signal C1 has a logic value "1" on condition that the test signal T1 or T2 is selected. Thus, the control signal C2 changes with respect to the test signal T1 or T2 on condition that the test signal T1 or T2 is selected.

In operation 410, the multiplexer 304 in FIG. 3 selects one of the fault signal F and the inversed signal FB as the signal FS according to the select signal S1. For example, the fault signal F is selected on condition that the select signal S1 has a logic value "0". Correspondingly, the inversed signal FB is selected on condition that the select signal S1 has a logic value "1." In some embodiments, the fault signal F is inversed by the inverter 302, in order to generate the inversed signal FB.

In operation 412, the multiplexer 308 in FIG. 3 selects one of the signal FS and the fault free signal FI as the final fault signal FO according to the control signal C2. For example, the signal FS is selected on condition that the control signal C2 has a logic value "1", and the fault free signal FI is selected on condition that the control signal C2 has a logic value "0."

In some embodiments, various operating conditions of the circuit 300 are shown in table 1 below. In table 1, "1" or "0" are logic values.

TABLE 1

|  | control signal (C2) | control signal (C1) | signal (FS) | fault free signal (FI) | final fault signal (FO) |
| --- | --- | --- | --- | --- | --- |
| condition 1 | 0 | — | — | — | FI |
| condition 2 | 1 | 1 | FB | 1 | FB |
| condition 3 | 1 | 1 | F | 0 | F |
| condition 4 | 1 | 0 | F | — | F |

For example, in condition 1, since the control signal C2 has the logic value "0," the multiplexer 308 thus selects the fault free signal FI as the final fault signal FO. In condition 2, since the control signal C1 and the fault free signal FI have the logic value "1," the select signal S1 thus has the logic value "1." Thus, the multiplexer 304 selects the inversed signal FB as the signal FS. Since the control signal C2 has the logic value "1," the multiplexer 308 thus selects the signal FS (for example, the inversed signal FB) as the final fault signal FO. In condition 3, since the control signal C1 has the logic value "1" and the fault free signal FI has the logic value "0", the select signal S1 thus has the logic value "0." Thus, the multiplexer 304 selects the fault signal F as the signal FS. Since the control signal C2 has the logic value "1," the multiplexer 308 thus selects the signal FS (for example, the fault signal F) as the final fault signal FO. In condition 4, since the control signal C1 has the logic value "0", the select signal S1 thus has the logic value "0." Thus, the multiplexer 304 selects the fault signal F as the signal FS. Since the control signal C2 has the logic value "1," the multiplexer 308 selects the signal FS (for example, the fault signal F) as the final fault signal FO.

As shown in table 1 above, the final fault signal FO can be the fault free signal FI, the fault signal F, or the inversed signal FB. Effectively, the fault behavior of the final fault signal FO includes the fault free signal FI, the inversed signal FB, and the fault signal F. In some embodiments, the fault free signal FI indicates a signal designed to test circuits under a normal operating environment. Correspondingly, the signal FS is designed to test the circuits under an abnormal operating environment.

As described above, in some embodiments, the final fault signal FO is outputted to a corresponding functional circuit, in order to verify robustness of the functional circuit. In some embodiments, on condition that the final fault signal FO is injected to the functional circuit, robustness of the functional circuit is determined based on whether an output of the functional circuit changes or not. In some embodiments, if a final fault signal FO, which is injected to the functional unit, causes a change to the output of the functional circuit, the final fault signal FO is referred to a dangerous fault. Correspondingly, if a final fault signal FO, which is injected to the functional unit, causes no change to the output of the functional circuit, the final fault signal FO is referred to a safe fault.

The above description of the method 400 includes exemplary operations, but the operations of the method 400 are not necessarily performed in the order described. The order of the operations of the method 400 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

Reference is now made to FIG. 5. FIG. 5 is a schematic diagram illustrating the fault generation circuit 104 and the functional circuit 1021 in FIG. 1, in accordance with some embodiments of the present disclosure. For ease of understanding, with respect to the embodiments of FIG. 1, like elements and signals in FIG. 5 are designated with the same reference numbers.

In some embodiments, multiple fault injection circuits 106 are configured to inject final fault signals FO to a corresponding functional circuit (for example, the functional circuit 1021). In some embodiments, the fault injection circuits 106 of the functional circuits 1021 are classified into k groups. For ease of understanding, FIG. 5 only shows two groups (for example, group G0 and group Gk). For example, the fault injection circuits 106A are classified into the group G0, and the fault injection circuits 106B are classified into the group Gk.

In some embodiments, each of the fault injection circuits 106A and 106B is configured to inject a corresponding final fault signal FO to a corresponding node of the functional circuit 1021. In some embodiments, the fault injection circuits 106A generate first final faults FO according to the fault signal F, and the control signals C1 and C2[0]. Correspondingly, the fault injection circuits 106B generate second final faults FO according to the fault signal F, and the control signals C1 and C2[k]. Effectively, the fault injection circuits 106A and the fault injection circuits 106B are controlled by different control signals C2 (for example, the control signals C2[0] and C2[k]). Thus, the group G0 and the group Gk of the functional circuit 1021 can be controlled individually.

The numbers of the fault injection circuits 106 and the groups are given for illustrative purposes only. Various numbers of the fault injection circuits 106 and the groups are within the contemplated scope of the present disclosure.

Figure 6:
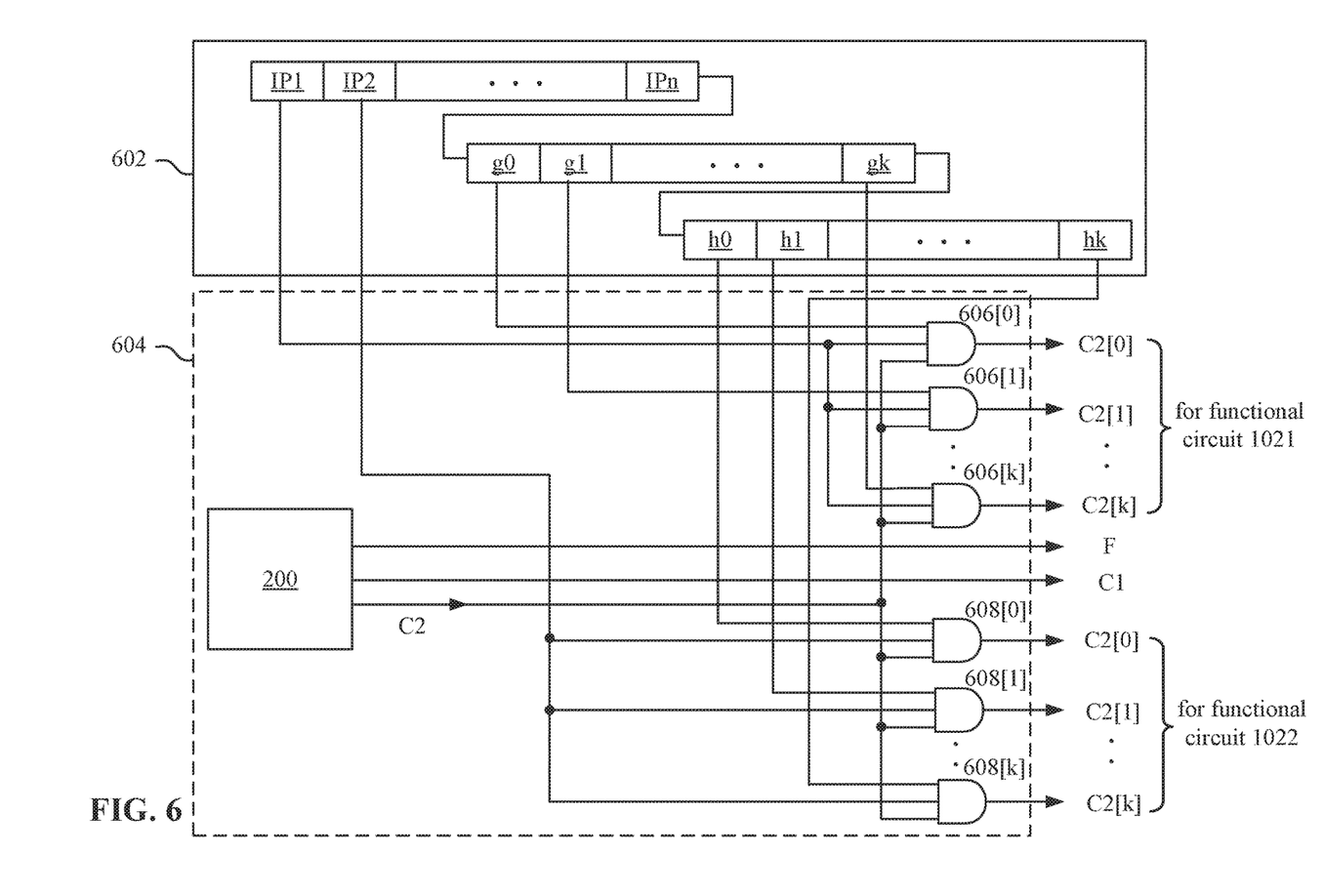
FIG. 6 is a schematic diagram illustrating a fault generation circuit in FIG. 1 and a register, in accordance with some embodiments of the present disclosure.

Reference is now made to FIG. 6. FIG. 6 is a schematic diagram illustrating the fault generation circuit 104 in FIG. 1 and a register 602, in accordance with some embodiments of the present disclosure. For ease of understanding, with respect to the embodiments of FIG. 1 and FIG. 2, like elements and signals in FIG. 6 are designated with the same reference numbers.

In some embodiments, each of the functional circuits 1021-1026 in FIG. 1 includes multiple groups (for example, k groups). In some embodiments, each of the groups is corresponding to multiple fault injection circuits 106, as shown in FIG. 5.

In some embodiments, the fault generation circuit 104 in FIG. 1 is implemented with a circuit 604 in FIG. 6. In some embodiments, the device 100 in FIG. 1 further includes the register 602, and the register 602 is coupled to the circuit 604. In some embodiments, the register 602 is configured to operate as a serial programming circuit, and is configured to store the information IP1-IPn, g0-gk and h0-hk. In some embodiments, the information IP1-IPn are configured to control different functional circuits respectively, the information g0-gk or h0-hk are configured to control the groups of one of the functional circuits respectively. For example, in some embodiments, the information IP1-IPn, g0-gk, and h0-hk having signal values that indicate a predetermined sequence of testing the groups of one of the functional circuits. In some other embodiments, the information IP1-IPn, g0-gk, and h0-hk are employed to designate which one or more logic gates (for example, NAND gates 606[0]-606[k] and 608[0]-606[k]) are determined to generate the control signal and C2 to the corresponding group.

The configurations of the information IP1-IPn, g0-gk, and h0-hk are given for illustrative purposes only. Various configurations of the information IP1-IPn, g0-gk, and h0-hk are within the contemplated scope of the present disclosure.

In some embodiments, the circuit 604 includes the circuit 200 in FIG. 2, in order to generate the fault signal F, and the control signals C1 and C2. The operations for generating these signals are similar to the embodiments in FIG. 2, and thus detailed descriptions are not provided herein again. The fault signal F and the control signal C1 are transmitted to the fault injection circuits 106 in all groups of all functional circuits.

In some embodiments, the circuit 604 further includes logic gates 606[0]-606[k] and 608[0]-608[k]. In some embodiments, each of the logic gates 606[0]-606[k] and 608[0]-608[k] is implemented with an AND gate. The logic gates 606[0]-606[k] are configured to generate first set of control signals C2[0]-C2[k] according to the control signal C2, the information IP1, and the information g0-gk. Correspondingly, the logic gates 608[0]-608[k] are configured to generate second set of control signals C2[0]-C2[k] according to the control signal C2, the information IP2, and the information h0-hk.

For example, the logic gate 606[0] include three input terminals, and these input terminals receive the control signal C2, the information IP1, and the information g0 respectively. The logic gate 606[0] performs an AND operation of the control signal C2, the information IP1, and the information g0, in order to generate the control signal C2[0]. The operations of other logic gates 606[1]-606[k] and 608[0]-608[k] are similar to the logic gate 606[0], and thus detailed descriptions are not provided herein again.

In some embodiments, the first set of control signals C2[0]-C2[k] are transmitted to k groups of the functional circuit 1021 respectively, and the second set of control signals C2[0]-C2[k] are transmitted to k groups of the functional circuit 1022 respectively. For example, the control signal C2[0] generated by the logic gate 606[0] is transmitted to the fault injection circuits 106 in a first group of the functional circuit 1021, the control signal C2[1] generated by the logic gate 606[1] is transmitted to the fault injection circuits 106 in a second group of the functional circuit 1021, and so on. Correspondingly, the control signal C2[0] generated by the logic gate 608[0] is transmitted to the fault injection circuits 106 in a first group of the functional circuit 1022, the control signal C2[1] generated by the logic gate 608[1] is transmitted to the fault injection circuits 106 in a second group of the functional circuit 1022, and so on. Thus, different groups in different functional circuits (for example, the functional circuit 1021 and the functional circuit 1022) can be controlled individually.

The implementations of the logic gates 606[0]-606[k] and 608[0]-608[k] are given for illustrative purposes only. Various implementations of these logic gates are within the contemplated scope of the present disclosure.

In some embodiments, a device is disclosed that includes a fault generation circuit and a first fault injection circuit. The fault generation circuit is configured to generate a fault signal and a plurality of control signals according to a mode signal. The first fault injection circuit is configured to inject a first final fault signal to an under-test device based on the fault signal and the plurality of control signals, in order to verify robustness of the under-test device.

Also disclosed is a device that includes a fault injection circuit and a fault generation circuit. The fault injection circuit is configured to inject a final fault signal to an under-test device, in order to verify robustness of the under-test device. The fault generation circuit is configured to select one of a plurality of test signals according to a mode signal, in order to output a fault signal. A fault behavior associated with the final fault signal is determined, by the fault injection circuit, based on the fault signal.

Also disclosed is a method that includes the operations below. One of a plurality of test signals is selected according to a mode signal, in order to output a fault signal. A plurality of control signals are generated according to the fault signal and the mode signal. A final fault signal is injected to an under-test device based on the fault signal and the plurality of control signals, in order to verify robustness of the under-test device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a fault generation circuit configured to generate a fault signal and a plurality of control signals according to a mode signal; and
   a first fault injection circuit configured to inject a first final fault signal to an under-test device based on the fault signal and the plurality of control signals, in order to verify robustness of the under-test device.

2. The device of claim 1, wherein the fault generation circuit comprises:
   a pulse width modulation circuit configured to generate a plurality of first test signals; and
   a first multiplexer configured to, according to the mode signal, output one of the plurality of first test signals, a second test signal, and a third test signal as the fault signal.

3. The device of claim 2, wherein the pulse width modulation circuit comprises:
a register configured to store information regarding to a pulse count, a pulse duty, and a pulse period;
a counter configured to generate a count signal; and
a comparator configured to generate the plurality of first test signals according to the count signal and the information.

4. The device of claim 2, wherein the fault generation circuit further comprises:
a first logic gate configured to output a first control signal of the plurality of control signals according to the mode signal; and
a second logic gate configured to output a second control signal of the plurality of control signals according to the fault signal and the first control signal.

5. The device of claim 4, wherein the first logic gate comprises an exclusive OR gate, and the exclusive OR is configured to perform an exclusive OR operation of two bits of the mode signal, in order to generate the first control signal.

6. The device of claim 4, wherein the second logic gate comprises an OR gate, and the OR gate is configured to perform an OR operation of the fault signal and an inversed signal that is an inverse of the first control signal, in order to generate the second control signal.

7. The device of claim 2, wherein the first test signal is configured to have a first logic value, the second test signal is configured to have a second logic value, and the first logic value is different from the second logic value.

8. The device of claim 2, wherein the plurality of first test signals comprises a first pulse signal and a second pulse signal, the first pulse signal comprises a single pulse, and the second pulse signal comprises a plurality of pulses.

9. The device of claim 2, wherein the first fault injection circuit comprises:
an inverter configured to generate an inversed signal that is an inverse of the fault signal; and
a second multiplexer configured to, according to a select signal, output one of the fault signal and the inversed signal as the first final fault signal.

10. The device of claim 9, wherein the first fault injection circuit further comprises:
a first logic gate configured to output the select signal according to a first control signal of the plurality of control signals and a fault free signal,
wherein the first control signal is determined based on the mode signal.

11. The device of claim 10, wherein the first fault injection circuit further comprises:
a third multiplexer configured to, according to a second control signal of the plurality of control signals, output one of the fault free signal and an output of the second multiplexer as the first final fault signal,
wherein the second control signal is determined based on the mode signal and an output of the first multiplexer.

12. The device of claim 10, wherein the first logic gate comprises an AND gate, and the AND gate is configured to perform an AND operation of the first control signal and the fault free signal, in order to generate the select signal.

13. The device of claim 1, further comprising:
a second fault injection circuit configured to inject a second final fault signal to the under-test device based on the fault signal and the plurality of control signals,
wherein the first final fault signal is injected to a first node of the under-test device, and the second final fault signal is injected to a second node of the under-test device.

14. A device, comprising:
a fault injection circuit configured to inject a final fault signal to an under-test device, in order to verify robustness of the under-test device; and
a fault generation circuit configured to select one of a plurality of test signals according to a mode signal, in order to output a fault signal,
wherein a fault behavior associated with the final fault signal is determined, based on the fault signal, by the fault injection circuit.

15. The device of claim 14, wherein the fault injection circuit is further configured to determine the fault behavior to be one of a first behavior, a second behavior, and a third behavior based on the fault signal, a fault free signal, and outputs of the fault generation circuit.

16. The device of claim 15, wherein the first behavior is associated with the fault signal, the second behavior is associated with an inverse of the fault signal, and the third behavior is associated with the fault free signal.

17. A method, comprising:
selecting one of a plurality of test signals according to a mode signal, in order to output a fault signal;
generating a plurality of control signals according to the fault signal and the mode signal; and
injecting a final fault signal to an under-test device based on the fault signal and the plurality of control signals, in order to verify robustness of the under-test device.

18. The method of claim 17, wherein generating the plurality of control signals comprises:
performing an exclusive OR operation of two bits of the mode signal, in order to generate a first control signal of the plurality of control signals.

19. The method of claim 18, wherein generating the plurality of control signals further comprises:
performing an OR operation of the fault signal and an inversed signal that is an inverse of the first control signal, in order to generate a second control signal of the plurality of control signals.

20. The method of claim 17, wherein injecting a final fault signal comprises:
outputting one of the fault signal, an inversed signal that is an inverse of the fault signal, and a fault free signal according to the plurality of control signals and the fault free signal, in order to generate the final fault signal.

* * * * *